United States Patent [19]

Hollingsworth

[11] 3,953,743

[45] Apr. 27, 1976

[54] LOGIC CIRCUIT

[75] Inventor: Richard James Hollingsworth, Hopewell, N.J.

[73] Assignee: RCA Corporation, New York, N.Y.

[22] Filed: Feb. 27, 1975

[21] Appl. No.: 553,637

[52] U.S. Cl. .............................. 307/205; 307/214; 307/215
[51] Int. Cl.² ................. H03K 19/08; H03K 19/22; H03K 19/36; H03K 19/40
[58] Field of Search ........... 307/205, 215, 304, 218, 307/214

[56] References Cited
UNITED STATES PATENTS

| 3,651,342 | 3/1972 | Dingwall | 307/304 X |
| 3,783,306 | 1/1974 | Hoffman | 307/205 X |
| 3,829,711 | 8/1974 | Crowle | 307/251 X |

Primary Examiner—John S. Heyman
Assistant Examiner—L. N. Anagnos
Attorney, Agent, or Firm—H. Christoffersen; S. Cohen; F. R. Perillo

[57] ABSTRACT

A circuit for generating a logic function and its logical complement of N binary variables utilizing MOS transistors which are all of the same conductivity type. The circuit may include an N input NAND gate comprising N MOS transistors and a load element, the conduction paths of the transistors connected in series with the load element to form a first series circuit and an inverter circuit having N+1 MOS transistors, the conduction paths of which are connected in series to form a second series circuit. Each series circuit is connected between the same operating voltage terminals and the two are interconnected to one another in such manner that the power dissipation of the circuit compares favorably with a CMOS inverter.

4 Claims, 2 Drawing Figures

LOGIC CIRCUIT

The invention disclosed herein was made in the course of, or under, a contract or subcontract thereunder with the Department of the Air Force.

Logic circuits that produce a voltage representing a given binary value as well as a voltage representing the logical complement of this value are well-known. When such circuits are used in integrated circuit form, the power consumed by the circuit during each logic state must be considered because of the somewhat limited ability of the integrated circuit to dissipate power. For example, a logic circuit such as an N input NAND gate produces an output signal representing binary zero only when all N of signals represent a binary one and produces an output representing a 1 at other times. The only condition in which current is being drawn from the power supply may be that in which the circuit produces a binary zero output signal. If this signal is applied to an inverter circuit, it would be desirable, from the standpoint of overall power consumption, to minimize the intervals during which the inverter is drawing current.

Where the inverter is realized using complementary metal-oxide-semiconductor (CMOS) transistors, the problem of power consumption is minimized. CMOS inverter circuits draw current only during the interval when the state of the inverter is being changed. No current is drawn, except for leakage current, when the inverter output voltage represents either binary value. However, it is not always possible to fabricate CMOS circuitry in all MOS applications. For example, where an integrated circuit such as a memory array contains P-type metal-oxide-nitride-semiconductor (MNOS) devices realized using silicon-on-sapphire (SOS) techniques, the circuits from which the memory control voltages are derived will utilize P-type MOS-SOS transistors. This is because present integrated circuit fabrication techniques do not readily permit fabrication of complementary MOS transistors on a chip containing MNOS devices. A problem thus exists of realizing an inverter circuit utilizing devices having the same polarity whose power consumption approaches that of a CMOS inverter. In the drawings:

Figure 1:
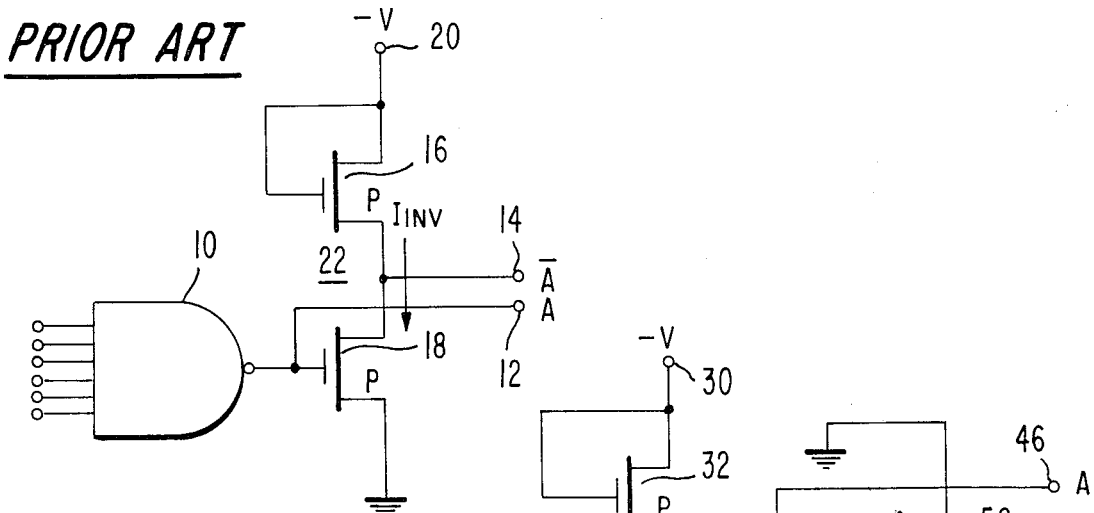
FIG. 1 is a schematic circuit diagram of a prior art circuit.

In the prior art circuit of FIG. 1, the output signal of a multiple input NAND gate 10 is coupled to terminal 12 where logical output A is obtained. This signal is also coupled to inverter 22 which produces the logical complement $\bar{A}$ at terminal 14. In the inverter, the source-drain paths of P-type MOS (PMOS) transistors 16 and 18 are serially connected between a terminal 20 to which an operating voltage $-V$ is applied and a terminal at a reference potential, shown as ground. The gate electrode of transistor 18 is the inverter input terminal. The gate electrode of transistor 16 is connected to its drain electrode at terminal 20.

For purpose of the present discussion, a voltage at or close to the supply voltage $-V$ is considered a logical one while a voltage at or close to the reference voltage is considered a logical zero. It should be appreciated that a reference to a logic signal as a particular binary value is a shorthand way of saying that the signal is at a voltage level corresponding to the particular binary value.

In the operation of the circuit of FIG. 1, the output A of gate 10 is a binary one except when all input terminals are at a voltage representing a binary one. At this time, the gate output is a binary zero. The signal A is applied to inverter 22. When signal A is a binary one, transistor 18 conducts, coupling terminal 14 to ground. When A is a binary zero, transistor 18 is cut off and terminal 14 is coupled to the voltage $-V$ via transistor 16. This latter device may be thought of as a nonlinear pullup resistor.

In the circuit of FIG. 1, where gate 10 is shown, for purposes of illustration as a six input gate, voltage A will be a binary one for 63 out of 64 combinations of inputs to gate 10. This means that the inverter output voltage at terminal 14 will be a binary zero or at ground potential for these 63 combinations. It is at this time that the earlier mentioned power dissipation problem arises. When the inverter output is at ground potential, an inverter current $I_{INV}$ flows. It is only when the voltage at terminal 14 is a binary one that this current will now flow, assuming that the inverter is driving a purely capacitive load such as the gate electrode of an MOS transistor.

The inverter must therefore dissipate power due to the current $I_{INV}$ for 63 out of 64 combinations of inputs to gate 10. A compromise must then be reached with respect to the design of inverter 22. The impedance of transistor 16 may be made relatively high to reduce the power dissipation. However, it is well-known that to maximize the response speed of the inverter, the impedance of transistor 16 should be relatively low. Thus, a somewhat unattractive design situation exists. The inverter can be of high speed in which case it will consume high power and this, in turn, will limit the circuit density on an integrated circuit chip. Or the circuit can be designed to consume low power in which case it will be of low speed. Or the design can be a compromise between the two. None of these solutions is very attractive in many situations.

Figure 2:
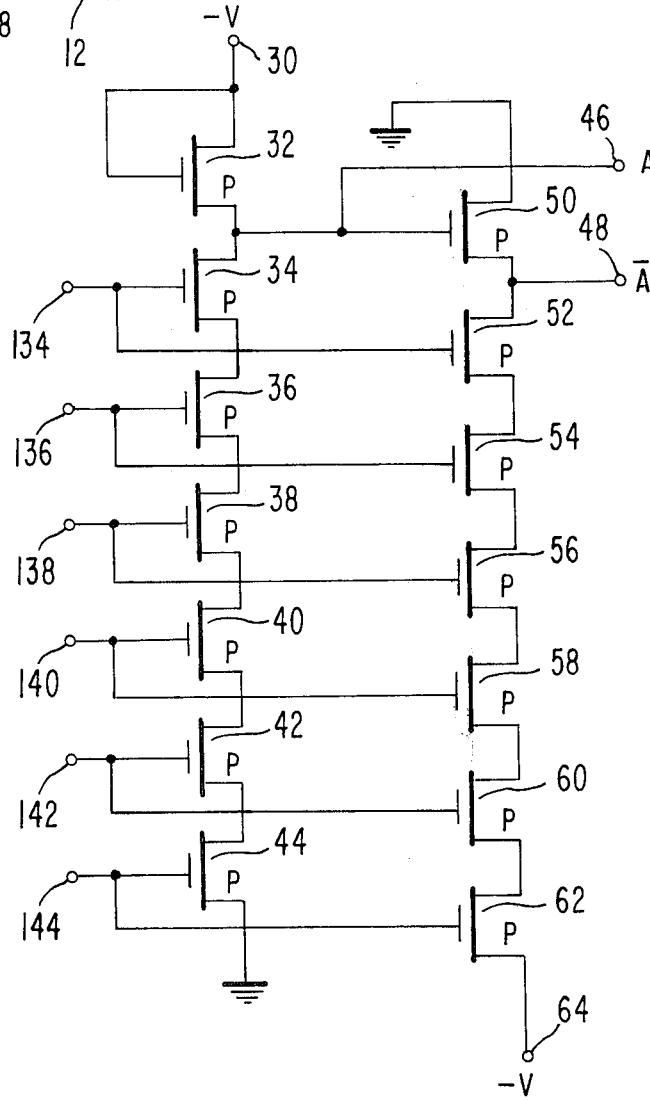
FIG. 2 is a schematic circuit diagram of a preferred embodiment of the present invention.

In the circuit of FIG. 2, the source-drain path of transistor 32 is coupled between supply voltage terminal 30 and output terminal 46 while its gate electrode is connected to its drain electrode at terminal 30. The source-drain paths of transistors 34, 36, 38, 40, 42 and 44 are serially connected between terminal 46 and a point at a reference potential, herein ground. The source-drain path of transistor 50 is coupled between a reference potential and terminal 48 while its gate electrode is connected to terminal 46. The source-drain paths of transistors 52, 54, 56, 58, 60 and 62 are serially connected between terminal 48 and operating voltage terminal 64 while the gate electrodes of these devices are connected respectively to the gate electrodes of transistors 34, 36, 38, 40, 42 and 44.

In the operation of the circuit of FIG. 2, transistors 32–44 comprise a six input PMOS NAND gate known in the art. The input terminals are the gate electrodes 134–144 respectively of transistors 34–44. This NAND gate is functionally equivalent to NAND gate 10 of FIG. 1. Output terminal 46 is at a binary one level when it is coupled through transistor 32 to the supply voltage terminal 30. This occurs whenever at least one of transistors 34–44 is off. When a binary one is applied to all input terminals 134–144, all transistors 34–44 conduct thereby coupling terminal 46 to ground or binary zero level.

When terminal 46 is at the binary one level, transistor 50 is conductive. As mentioned earlier, a binary one at terminal 46 indicates that at least one of PMOS transistors 34–44 is nonconducting. The same logic inputs that achieve this condition are also applied to the gate electrodes of PMOS transistors 52–62. Therefore, at least one of the latter devices is also nonconducting. Terminal 48 is thus at ground level and is the complement of the signal at terminal 46. It should be noted that the current $I_{INV}$ present for similar logic conditions in the circuit of FIG. 1 is not present in the instant circuit, again assuming the connection of a purely capacitive load connected to terminal 48.

When terminal 46 is at the binary zero level, all of transistors 34–44 are conductive as are transistors 52–62. At the same time, transistor 50 is rendered nonconductive because the gate electrode of this device is at ground potential. Terminal 48 is coupled to the potential at terminal 64, −V, once more providing the complement of the signal at terminal 46. It should once more be noted that when devices 52–62 are all conductive, inverter current $I_{INV}$ still does not flow because transistor 50 is nonconductive. Thus, a logical inversion operation has been achieved in a circuit utilizing only PMOS devices where no inverter current flows except during a change of logic state. One of the prime advantages of a CMOS inverter, i.e., low power dissipation, has been realized using only transistors of the same conductivity type. The circuit of FIG. 2, where no inverter current flows, thus performs the same function as the circuit of FIG. 1 where inverter current existed for 63 out of 64 logic gate input combinations.

The resultant reduction in power dissipation has several advantages. The lower power consumption permits greater packaging densities when the circuits are realized in integrated circuit form. Also, the overall current that must be provided by the system power supply is reduced. Finally, the devices 50–62 of the circuit of FIG. 2 may be designed primarily with respect to minimum response time rather than power dissipation, thereby eliminating the unsatisfactory compromise mentioned in the introductory portion of this application.

What is claimed is:

1. The combination of an N input logic circuit and an inverter comprising:
   a first terminal for an operating voltage at a level representing one binary value and a second terminal for an operating voltage at a level representing the other binary value;
   load means; 'N MOS transistors of one conductivity type each having a conduction path and a gate electrode, said conduction paths connected in series with said load element to form a first series circuit, said first series circuit including at one end said load element and connected at that end to said first terminal and said first series circuit connected at its other end to said second terminal;
   N+1 MOS transistors of the same conductivity type as the MOS transistors of the first series circuit, each of the N+1 transistors having a conduction path and a gate electrode, the conduction paths of the N+1 transistors connected in series to form a second series circuit, said second series circuit connected at the one end having the first of said transistors to said second terminal and at the other end having the N+1$^{th}$ of said transistors to said first terminal;
   a first output terminal at the connection of said load element to the N series connected transistors of the first series circuit, said first output terminal connected to the gate electrode of said first transistor of the second series circuit;
   a second output terminal at the connection between the first transistor conduction path and the following transistor conduction path of the second series circuit; and
   N input terminals, connected to the gate electrodes of the N transistors of the first series circuit, respectively, and to the gate electrodes of the N transistors, respectively, other than the first transistor, of the second series circuit.

2. A circuit for generating a binary logic function and the logical complement of said function comprising, in combination:
   first and second output terminals;
   N input terminals, where N is an integer greater than one, to which input logic signals may be applied;
   first means coupled to said first output terminal responsive to said input logic signals for producing a voltage at said first terminal representing a particular binary value whenever all of the input logic signals represent a first binary value and the other binary value for all other combinations of input logic signals; and
   second means, comprising transistors of like conductivity having a first path coupled between said second output terminal and a first voltage corresponding to said other binary value and a second path coupled between said second output terminal and a second voltage corresponding to said particular binary value, responsive to said input signals and to said first means output voltage, for coupling said second output terminal to said first voltage but not to said second voltage whenever a voltage corresponding to said particular binary value is present at said first output terminal and to said second voltage but not to said first voltage whenever a voltage corresponding to said other binary value is present at said first output terminal.

3. The combination of claim 2 where said first means comprises, in combination:
   load means coupled between a first operating potential and said first output terminal; and
   N MOS transistors, each transistor having a conduction path and a gate electrode, the conduction paths of said N transistors serially connected between said first output terminal and a second operating potential and the gate electrodes of said N transistors connected, respectively, to said N input terminals.

4. The combination of claim 2 where said second means comprises N+1 MOS transistors, each transistor having a conduction path and a gate electrode, the conduction paths of said N+1 transistors serially connected between said first voltage and said second voltage, the gate electrode of the first of said N+1 transistors connected to said first output terminal, the gate electrodes of the remaining transistors connected respectively to said N input terminals, and the connection node between the first and second of said N+1 transistors connected to said second output terminal.

\* \* \* \* \*